United States Patent [19]

Butt

[11] Patent Number: 4,594,770
[45] Date of Patent: Jun. 17, 1986

[54] METHOD OF MAKING SEMICONDUCTOR CASING

[75] Inventor: Sheldon H. Butt, Godfrey, Ill.

[73] Assignee: Olin Corporation, New Haven, Conn.

[21] Appl. No.: 639,168

[22] Filed: Aug. 9, 1984

Related U.S. Application Data

[62] Division of Ser. No. 398,497, Jul. 15, 1982, Pat. No. 4,480,262.

[51] Int. Cl.⁴ .................. H01L 21/52; H01L 21/50; H01L 23/40; H01L 23/10
[52] U.S. Cl. ........................................ 29/588; 29/589; 174/52 FP
[58] Field of Search ................. 29/588, 589; 357/74, 357/81, 84; 174/52 FP

[56] References Cited

U.S. PATENT DOCUMENTS

| | | | |
|---|---|---|---|
| 3,341,369 | 9/1967 | Caule et al. | 148/2 |
| 3,676,292 | 7/1972 | Pryor et al. | 65/59.34 |
| 3,943,623 | 3/1976 | Mizutani et al. | 174/52 FP |
| 4,079,511 | 3/1978 | Grabbe | 357/72 X |
| 4,105,861 | 8/1978 | Hascoe | 174/52 FP |
| 4,107,555 | 8/1978 | Haas et al. | 357/74 X |
| 4,126,758 | 11/1978 | Krumme | 357/74 X |
| 4,266,239 | 5/1981 | Miyagaki et al. | 357/84 |
| 4,278,990 | 7/1981 | Fichot | 357/81 |
| 4,293,768 | 10/1981 | Adachi et al. | 357/84 X |
| 4,323,405 | 4/1982 | Uno et al. | 29/588 |
| 4,330,790 | 5/1982 | Burns | 357/72 X |
| 4,345,108 | 8/1982 | Dathe et al. | 357/74 |
| 4,480,262 | 10/1984 | Butt | 357/81 |

FOREIGN PATENT DOCUMENTS 2039145  12/1979  United Kingdom ................. 29/588

OTHER PUBLICATIONS

Neighbour et al., "Factors Governing Aluminum Interconnection Corrosion in Plastic Encapsulated Microelectronic Devices", Microelectronics and Reliability, Pergamon Press, Great Britain, vol. 16, 1977, pp. 161–164.

Olberg et al., "Factors Contributing to the Corrosion of the Aluminum Metal On Semiconductor Devices Packaged in Plastics", Microelectronics and Reliability, Pergamon Press, Great Britain, vol. 15, 1976, pp. 601–611.

Primary Examiner—Brian E. Hearn
Assistant Examiner—Hunter L. Auyang
Attorney, Agent, or Firm—Howard M. Cohn; Barry L. Kelmachter; Paul Weinstein

[57] ABSTRACT

A casing for an electrical component comprises a metal lead frame having the electrical component connected thereto. A metal base member is bonded to one surface of the lead frame. A plastic housing member is bonded to a second surface of the lead frame. An adhesive seals and bonds the metal base member and plastic housing member to the lead frame so as to enclose the electrical component.

7 Claims, 7 Drawing Figures

METHOD OF MAKING SEMICONDUCTOR CASING

This application is a division of application Ser. No. 398,497, filed July 15, 1982, now U.S. Pat. No. 4,480,262.

The present invention is directed to a method and apparatus for encasing a semiconductor and more particularly for providing a highly reliable casing with a metal substrate adhesively bonded to a preformed plastic top.

In the electronic industry, common plastic semiconductor packages are plastic dual-in-line packages (DIP), plastic Quad Paks (plastic chip carriers) and a somewhat modified form for discrete semiconductor devices. These different configurations are basically plastic molded packages in which an electronic device is supported on a lead frame and molded into or encapsulated in plastic. The resulting plastic packages are prone to problems which can either decrease their reliability or their cost of manufacture.

Firstly, failures in the plastic to metal bond, i.e. between the lead frame and the plastic package, provide an avenue through which moisture and other contaminants can reach the electrical device and cause corrosion failure. This problem has been more fully explained and documented in an article entitled "Factors Governing Aluminum Interconnection Corrosion in Plastic Encapsulated Microelectronic Devices" by Neighbour and White, published in *Microelectronics and Reliability*, by Pergamon Press in Great Britain, Volume 16, 1977, pages 161-164.

Another source of failure may arise from the diffusion of contaminants through the plastic or perhaps as a result of gradual degradation of the plastic. This type of failure has been described in an article entitled "Factors Contributing to the Corrosion of the Aluminum Metal on Semiconductor Devices Packaged in Plastics" by Olberg and Bozarth, published in *Microelectronics and Reliability*, by Pergamon Press in Great Britain, Volume 15, 1976, pages 601-611.

Generally, the power consumption of the electronic components is quite modest and the heat generated during their operation is comparatively small. However, as the number of functions incorporated on a single chip become greater and/or the functions upon the chip are spaced more closely together, the heat generated becomes a significant consideration. Also, the current trend towards incorporating relatively "high power" components into integrated circuits so as to reduce external components for "power functions" increases the generation of heat. Accordingly, the capability of dissipating the greater heat being generated becomes more important.

The present conventional packaging technology relies on heat generated by the chip to be transferred through the plastic to the leads. It then passes along the leads to the outside of the package. Ultimately, it is transferred from the leads through radiation and/or convection to the atmosphere or to the printed circuit board to which the lead frame is mounted. The heat transfer along the lead frame may be constricted by the small dimension of the individual leads. A secondary heat transfer path is from the chip through the plastic to the outside surface of the plastic package. The heat transfer, in this case, is inhibited by the considerable distance which the heat must flow in order to reach the lead frame or the outside surface of the package.

In the manufacture of conventional plastic packages, the plastic encapsulating material is prevented from flowing into unwanted areas by providing "dams" on the lead frame. This requires an extra step of removing the dams after curing of the material. Even with the dams, some plastic flash extrudes beyond the boundaries of the mold cavity, adheres to the lead frame and must be finally removed. Preventing and/or eliminating this flash material is an added expense and bother in the manufacture of the plastic packages.

Reliability problems are also created by the plastic encapsulant flowing around the device, the lead frame and the lead wires. As the viscous molding compound flows around the wires, significant dynamic stresses may be imposed upon the wire and upon the relatively delicate bonds between the wire and the device and/or the lead frame. Further, materials may be present in the plastic encapsulant which may be deleterious to the device, the bonding material or the lead frame and may react with any of these components and particularly with the chip causing degradation thereof.

U.S. patent application Ser. No. 390,081 entitled "Semiconductor Casing" and U.S. patent application Ser. No. 390,095 (now U.S. Pat. No. 4,410,927) entitled "Improved Semiconductor Package" both by Sheldon H. Butt are directed to improvements in semiconductor packaging.

It is a problem underlying the present invention to provide a package for an electrical component which has a high reliability at a cost that may be less than the present state of the art technology.

It is an advantage of the present invention to provide a casing for an electrical component which obviates one or more of the limitations and disadvantages of the described prior arrangements.

It is a further advantage of the present invention to provide a casing for an electrical component which is substantially resistant to the diffusion of contaminants.

It is a further advantage of the present invention to provide a casing for an electrical component which provides relatively good heat transfer characteristics.

It is a yet further advantage of the present invention to provide a casing for an electrical component which is relatively inexpensive to manufacture.

It is a still yet further advantage of the present invention to provide a casing for an electrical component which may be assembled without the use of high temperature processes.

Accordingly, there has been provided a casing for an electrical component comprising a metal lead frame having the electrical component connected thereto. A metal base member is bonded to one surface of the lead frame. A plastic housing member is bonded to a second surface of the lead frame. An adhesive seals and bonds the metal base member and plastic housing member to the lead frame so as to enclose the electrical component.

The invention and further developments of the invention are now elucidated by means of the preferred embodiments shown in the drawings.

Figure 1:
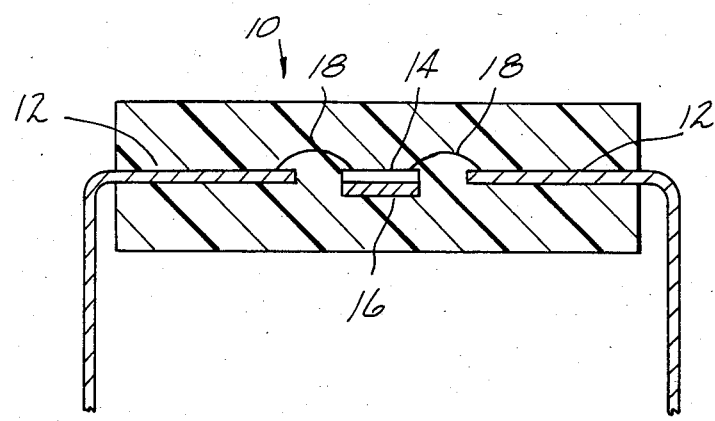
FIG. 1 is a cross section of a typical prior art casing for an electrical component.

A typical plastic package 10 for sealing an electrical component in accordance with the present technology is shown in FIG. 1. This general configuration is used in plastic dual-in-line packages, plastic Quad Paks and in a somewhat modified form as packages for discrete semiconductor devices. The method of producing such a plastic package is described herein in order to have a better appreciation for the advances of the present invention.

Figure 2:
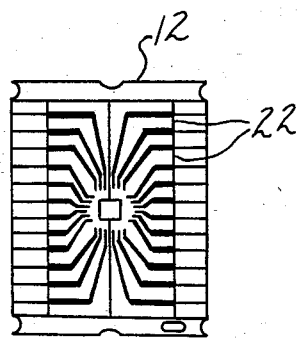
FIG. 2 is a top view of a typical prior art lead frame.

Beginning with a lead frame 12, as shown in FIG. 2, the semiconductor chip 14 is bonded to the pad 16 of the lead frame. This bonding may be accomplished by either using a conductive adhesive as is often the case in integrated circuits or a metallic solder or brazing material as in the case of many discrete devices. Typically, the plastic adhesives include epoxies and polyimides. They may be formulated with powdered metals, such as silver, to improve their thermal conductivity and/or to provide moderate electrical conductivity. The metal joining materials may include a gold-silicon eutectic brazing compound. The bond is formed by gold plating the reverse side of the silicon chip and subsequently using a diffusion anneal to achieve the desired gold-silicon eutectic composition. In addition, other solders may be used as required.

The interconnection between the chip 14 and the lead frame 12 is typically provided by means of small diameter lead wires 18 (usually gold) which are metallurgically bonded to the tips of the leads in the lead frame and to the chip. In most integrated circuits, the bonding technique is either thermosonic or thermocompression bonding. Thermosonic bonding is a combination of mechanically induced metallurgical bonding at temperatures above ambient in conjunction with the addition of ultrasonic energy. Thermocompression bonding is mechanical deformation at elevated temperature without the addition of the ultrasonic energy. A foil "spider" is often used as an alternative to the wires. The foil itself may be bonded to the chip by either thermosonic or thermocompression bonding.

After the electrical interconnections have been made, the device is encapsulated within a plastic block. Typically, a thermosetting plastic, such as epoxy, is used and encapsulation is accomplished by transfer molding. Then, the encapsulated components are removed from the mold and aged so as to complete polymerization of the thermosetting plastic.

In order to avoid extrusion of the plastic encapsulating material into unwanted areas during molding, "dams" 22, as seen in FIG. 2, are incorporated by each of the leads within the lead frame. After curing, the "dams" must be removed in order to prevent a short circuit. This is typically accomplished by a punch press.

Despite the use of the "dams", some plastic, known as "flash", extrudes between the boundaries of the mold cavity and adheres to the lead frame. This flash must be removed from the lead frames before the package is essentially complete.

Figure 3:
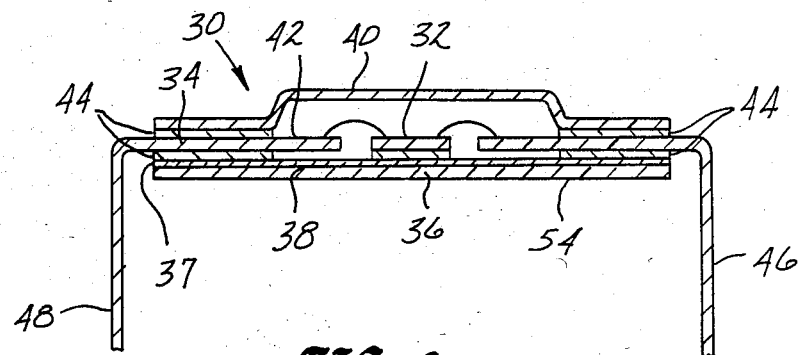
FIG. 3 is a cross section of a casing for an electrical component in accordance with the present invention.

The present invention as shown in FIG. 3 provides a casing 30 for an electrical component 32. A metal lead frame 34 has the electrical component 32 electrically connected thereto. A metal base member 36 is bonded to one surface 38 of the lead frame. A plastic housing member 40 is bonded to a second surface 42 of the lead frame. Adhesive material 44 seals and bonds the metal base member and the plastic housing member to the lead frame so as to enclose the electrical component 32.

As seen in FIG. 3, the terminal leads 46 and 48 project between the base member and the housing member external to the casing 30. Although the terminal leads preferably protrude from two sides of the casing, it is within the scope of the present invention for the terminal leads to extend from any number of sides. There may be surface areas between the housing member 40 and base member 36 which are in contact with each other. Then, the adhesive provided between these surface areas would bond and seal them together. The housing member or premolded plastic lid 40 may be shaped to form a hollow enclosure as shown so as to not interfere with the chip 32 or electrical wires 50. However, the exact shape of the casing 30 does not form a part of the present invention and may be any shape as desired.

The metal substrate 36 consists of a high thermal conductivity metal. The substrate is preferably formed of a high conductivity copper or copper alloy such as CDA alloy C151. To provide better adhesion, the high conductivity metal substrate may be clad with a thin layer 37 of any desired metal or alloy which bonds strongly with an adhesive. In accordance with this invention, it has been found that certain copper and copper base alloys provide very strong bonds with different adhesives and thereby prevent diffusion of contaminants between the adhesive and the metal substrate. Suitable copper base alloys for use in the present invention contain from 2 to 12% aluminum. In particular, CDA alloy C638 as disclosed in U.S. Pat. No. 3,676,292 to Pryor et al., containing 2.5 to 3.1% aluminum, 1.5 to 2.1% silicon, and 0.25 to 0.55% cobalt is most useful in the provision of a metal in accordance with this invention. Impurities may be present which do not prevent bonding in a desired environment. Further, it may be preferable to use CDA alloy C6381, as disclosed in U.S. Pat. No. 3,341,369 to Caule et al. Alloy C6381 is similar to alloy C638 except for the omission of cobalt. This omission reduces cost and entails some reduction in annealed mechanical properties.

The advantage of using either alloy C638 or C6381 is that they bond well to adhesives, such as epoxies, and are, therefore, substantially impervious to the diffusion of contaminants between the epoxy and the metal substrate. Also, the metal is an excellent barrier to any contaminants passing directly through the casing. Thus, the casing of the present invention has reduced the potential for interdiffusion of contaminants since a substantial portion of the package is metal and the interdiffusion can substantially only occur in the relatively thin layer of adhesive which seals the package and possibly through the preformed lid.

The lead frame 34 may be similar to the lead frame as shown in FIG. 2. However, the dams 22 are not required since there is no molding causing an extrusion of plastic from the mold cavity. The lead frame is formed of a material which strongly bonds to the adhesive. Preferably, this material is CDA alloy C638 or C6381 as described hereinabove.

A premolded plastic lid or housing member 40 is provided to enclose the chip 32 in the casing 30. The premolded plastic lid is preferably formed of a suitable thermoplastic resin which may be particularly impervious to diffusion of contaminants therethrough. The lid 40 may be formed in any desirable configuration so as to provide an adequate space to contain the chip.

The present invention uses any adhesive 44, such as an epoxy, which provides a strong bond with any metal or alloy and with the plastic top. The specific adhesive used is determined by the constraints implied by the specific chip and the different service environments. Some specific factors to consider are the frequency of the electrical signal, the dielectric constant, the sensitivity of the chip to contaminants, constituent bleedout of the adhesive, and the a adhesive's permeability to moisture.

A number of different adhesives have been found to bond and seal the layers together. Several examples are provided in the chart below.

| | Type | Name | Manufacturer |
|---|---|---|---|
| a. | 2 part room temperature structural eooxy | Bondmaster M688 | National Adhesives Co. |
| b. | 1 part thermosetting encapsulating epoxy | Morton 410B | Morton Chemical Co. |
| c. | thermoplastic | Philips Ryton | Philips Petroleum |
| d. | encapsulating epoxy | Plaskon X7200 Plaskon X7200LS | Plaskon Electronic Materials |

The sequence of manufacturing the casing of the present invention is provided hereinbelow with certain advantages pointed out. First, the lead frame 34 is adhesively bonded to the substrate 36 using an epoxy or other adhesive material as set out hereinabove. Then, the chip may be adhesively bonded to the substrate using the type of adhesives normally used in conventional packages described hereinabove. Since most integrated circuits use adhesive chip bonding, it is possible to combine these first two assembly operations into a single sequential automated operation. Alternatively, the chip may be metallically bonded to the substrate as described above. In this case, the chip bonding operation precedes the lead frame bonding operation in order to avoid exposure of the adhesive lead frame bond to the elevated temperatures which may be required for metallic chip bonding. Next, the chip is connected to the lead frame with either lead wires or with a TAB spider, as in the case of conventional package assembly. Finally, the premolded plastic lid is adhesively bonded to the lead frame and/or metal substrate to complete the closure of the package.

Since the package is not molded around the lead frame-chip subassembly, it is not necessary to provide a dam to minimize extrusion of the plastic from a mold cavity. It follows that it is also not necessary to remove either the dam or any flash. By eliminating these two operations, four manufacturing operations can replace the previous requirement of six. However, the substrates must be stamped from metal strip as a separate preliminary operation. This may be accomplished by high speed in a blanking press. Additionally, the lids must be premolded. This also can be accomplished at high speed using a thermoplastic resin.

In the present technology, parts are handled in sticks consisting of from 10 to 20 lead frames carried together in a web. After chip attachment and wire bonding, the sticks are individually assembled into cavities in a multi-cavity transfer molding device. In the proposed technology, handling the sticks is not required. The assembly may be automated on a reel-to-reel basis; alternatively, individual components may be magazine fed to a continuously operating automated assembly line. Of course, handling the sticks is still possible if for some special reason this is considered desirable.

Figure 4:
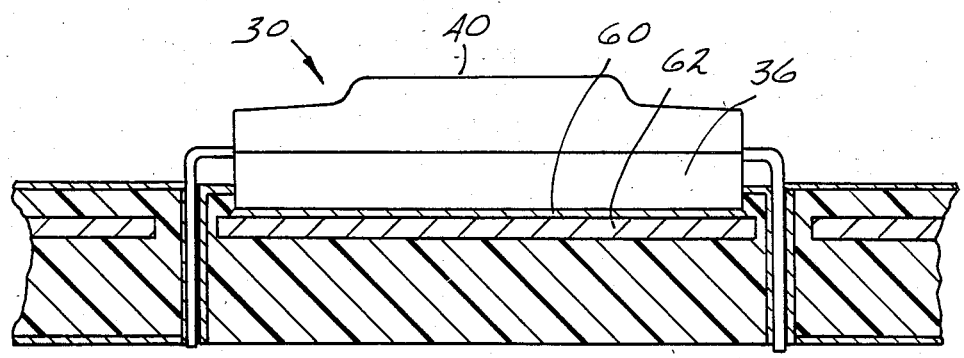
FIG. 4 is a cross section of a casing positioned upon a printed circuit board in accordance with the present invention.
Figure 5:
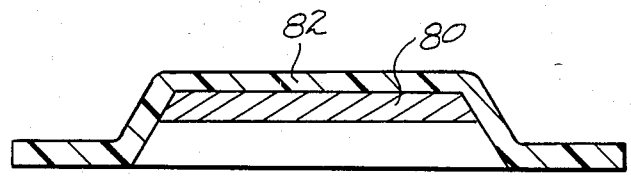
FIG. 5 is a cross section of a molded lid having a contaminant absorbing material.

A significant advantage of the present invention resides in the ability to dissipate heat of the package. In the proposed package, heat is conducted directly from the chip to the high conductivity metal substrate. It need only traverse a very thin layer of adhesive used in the adhesive chip mounting. The impedance of this thin layer may be further reduced by using a metal powder filled, thermally conductive adhesive. The heat transfer path out of the package is broad and relatively short through the high conductivity substrate. Heat may be dissipated from from the substrate 36 by convection and/or radiation from its outer surface 54. Alternatively, the high conductivity substrate may be attached to elements on a printed circuit board expressly designed to provide for heat dissipation. These may be either on the primary surface of the board, or the substrate may be fitted into a recess in the surface of the PC board. Preferably, the substrate is bonded with solder 60 to a ground plate 62 as shown in FIG. 4.

Figure 6:
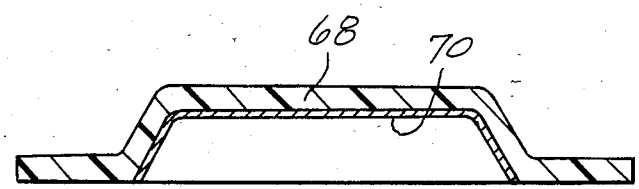
FIG. 6 is a cross section of a lid having a metal foil insert.
Figure 7:
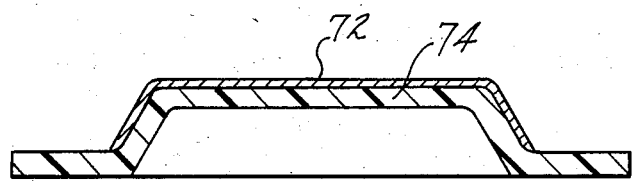
FIG. 7 is a cross section of a plastic lid having a metal foil covering a portion of the external surface of the lid.

A major source of contaminants which may enter a plastic package is the diffusion through the plastic of various contaminating gases, particularly water vapor. These contaminating gases may have a very deleterious effect on the chip. Of course, the metallic substrate is impervious to such diffusion and its use somewhat mitigates infiltration of water vapor and other contaminants. Also, the plastic selected for the lid may be relatively impervious to interdiffusion since its molding characteristics are not limited to those which are compatible with molding around a finished device as in the case of the conventional packages. To further inhibit interdiffusion into the package, the molded plastic lid 68 may be modified as in FIG. 6 to provide a metal foil membrane 70 on its inner surface to provide an impervious barrier to interdiffusion. This metal foil may be formed of any desirable metal or alloy and attached to the lid in any conventional manner. Another embodiment of this concept is illustrated in FIG. 7 where the metal foil membrane 72 is provided on the outside surface of the molded plastic lid 74. In either of these embodiments, the only remaining path for diffusion is the thin layer of adhesive which is used to bond the lead frame to the substrate and the lid.

Another embodiment of the invention provides a layer of moisture or contaminant absorbing material 80 placed upon the internal surface of the lid 82. This material scavenges water vapor and other contaminants which may diffuse into the package. The layer may consist of materials such as silica gel, activated carbon or mixtures of such materials. The material may be joined to the lid 82 by any conventional technique.

In addition to the advantage of better thermal dissipation characteristics and of higher reliability, the package of the present invention offers the additional advantage of eliminating significant dynamic stresses upon the wire and the delicate bond between the wire and the device and the lead frame. This differs from conventional packaging where the molded encapsulant flows around the device, the lead frame and the lead wires and is in contact with them. As the relatively viscous molding compound flows around the wires, significant dynamic stresses are imposed. The present invention eliminates these problems and thereby improves the reliability of the completed casing. In addition, materials present in the molding compound which may be deleterious to the device, the bonding wire or the lead frame may react with these components and particularly with the chip. This results in degradation of the device which is not present in the embodiments of the present invention.

The patents, patent applications, and publications set forth in this application are intended to be incorporated by reference herein.

It is apparent that there has been provided in accordance with this invention a casing for an electrical component and a process for manufacturing the casing which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. The method of forming a casing adapted to receive an electrical component, comprising the steps of:
   providing a metal base member;
   providing a metal leadframe having first and second oppositely disposed surfaces;
   disposing the first surface of said metal leadframe adjacent said first surface of said leadframe;
   providing a premolded plastic housing member adjacent the second surface of said leadframe, said premolded plastic housing member having an inner surface shaped to form a hollow enclosure, said enclosure adapted to receive said electrical component, said housing member further having a metal foil substantially over the inner surface of said housing member to form a substantially impervious barrier to interdiffusion of contaminants into said enclosure through said housing member; and
   adhesively bonding said metal leadframe between said housing member and said base member for sealing said metal leadframe.

2. The method of claim 1 further including the step of:
   electrically connecting said electrical component to said leadframe prior to bonding said housing member and said base member together whereby said electrical component is sealed within said enclosure.

3. The method of claim 2 including the step of selecting said base member and said leadframe from a copper or copper base member.

4. The method of claim 3 including the step of selecting copper alloy consisting essentially of 2 to 12% aluminum and the balance essentially copper.

5. The method of claim 4 including the step of selecting copper alloy consisting essentially of 2.5 to 3.1% aluminum, 1.5 to 2.1% silicon and the balance essentially copper.

6. The method of claim 5 including the step of cladding said base member with a high conductivity metal or alloy layer.

7. The method of claim 6 including the step of disposing a contaminant absorbing material within the hollow enclosure of said premolded plastic member.

* * * * *